(12) United States Patent
Baccini

(10) Patent No.: US 7,960,980 B2
(45) Date of Patent: Jun. 14, 2011

(54) TESTING DEVICE TO TEST PLATES FOR ELECTRONIC CIRCUITS AND RELATIVE METHOD

(75) Inventor: Andrea Baccini, San Biagio di Callalta (IT)

(73) Assignee: Applied Materials, Inc., Santa Clara, CA (US)

( * ) Notice: Subject to any disclaimer, the term of this patent is extended or adjusted under 35 U.S.C. 154(b) by 265 days.

(21) Appl. No.: 12/256,682

(22) Filed: Oct. 23, 2008

(65) Prior Publication Data

US 2009/0263217 A1 Oct. 22, 2009

(30) Foreign Application Priority Data

Dec. 18, 2007 (IT) .............................. UD2007A0239

(51) Int. Cl.
*G01R 31/00* (2006.01)
*G01R 31/20* (2006.01)
(52) U.S. Cl. ........... 324/750.16; 324/750.2; 324/757.01; 324/757.03
(58) Field of Classification Search ............. 324/750.16, 324/750.2, 757.01, 757.03
See application file for complete search history.

(56) References Cited

U.S. PATENT DOCUMENTS

| 5,374,888 | A | * | 12/1994 | Karasawa | ..................... 324/765 |
| 6,094,061 | A | | 7/2000 | Saouli et al. | |
| 6,232,766 | B1 | | 5/2001 | Saouli et al. | |
| 6,411,079 | B1 | * | 6/2002 | Nishikawa | ................. 324/158.1 |
| 2005/0151551 | A1 | | 7/2005 | Okuda et al. | |
| 2007/0069752 | A1 | * | 3/2007 | Ito et al. | ........................ 324/765 |

FOREIGN PATENT DOCUMENTS

| DE | 41 14 284 | 11/1992 |
| DE | 10 2005 062 936 | 7/2007 |
| EP | 1 199 570 | 4/2002 |

* cited by examiner

*Primary Examiner* — Roberto Velez
(74) *Attorney, Agent, or Firm* — Patterson & Sheridan, L.L.P.

(57) ABSTRACT

A testing device to test a plate for electronic circuits, comprising transport members able to transport the plate along an axis of feed (Y), at least from an entrance station to a testing station defining a testing plane (P'), and testing members, disposed in correspondence with the testing station. The testing device also comprises an alignment station defining an alignment plane (P), disposed upstream of the testing station, and alignment members, disposed in correspondence with the alignment station, able to dispose the plate in an aligned position, in which the plate is disposed symmetrical both with respect to the axis of feed (Y) and also with respect to a first axis (X) substantially transverse and co-planar to the axis of feed (Y).

17 Claims, 1 Drawing Sheet

TESTING DEVICE TO TEST PLATES FOR ELECTRONIC CIRCUITS AND RELATIVE METHOD

FIELD OF THE INVENTION

The present invention concerns a testing device and method to test plates for electronic circuits having a defined geometric shape.

In particular, the device is able to be used in a plant for working plates for electronic circuits, such as, preferably but not exclusively wafers, for example silicon based or alumina based, in particular for photovoltaic cells or for green-tape type circuits, in order to carry out a quality test on said plates.

BACKGROUND OF THE INVENTION

Plants for the treatment of plates for electronic circuits, for example silicon based or alumina based wafers, in particular for photovoltaic cells or for green-tape type circuits, are known, which comprise at least a testing device to carry out a quality test on said plates. By quality test we mean, for example but not exclusively, to verify the capacity of said plates to conduct electric current or the capacity of said plates to tolerate a determinate level of intensity of the electric current.

These known devices comprise transport means, able to transport the plates from a previous work station to a testing station, in correspondence with which a testing means is disposed, for example an automated electromechanical arm provided at one end with a plurality of sensors able to measure the intensity of electric current. The known devices also comprise a TV camera able to detect the position of the plate on the testing station and a processing and command unit able to receive and to process the information arriving from the TV camera to command the positioning of the testing means in order to dispose said means aligned and in axis with the plate, so as to be able to achieve an effective testing process.

One disadvantage of these known testing devices is that, in order to guarantee effective and accurate measurement, their position must be correct and centered with respect to the position of the plate. Therefore, the testing means is complex, and requires the use of high quantities of energy and materials in order to guarantee correct positioning in every stage of the testing; it also needs frequent and laborious maintenance operations so that it can function correctly. Furthermore, the need to correct the position of the testing means substantially for every plate to be tested causes a slow-down in the testing process and consequently an increase in production times.

Purpose of the present invention is to achieve a testing device to test plates for electronic circuits that requires the use of reduced quantities of energy and materials, that does not need frequent and laborious maintenance operations and that speeds up the testing process and consequently increases productivity.

The Applicant has devised, tested and embodied the present invention to overcome the shortcomings of the state of the art and to obtain these and other purposes and advantages.

SUMMARY OF THE INVENTION

The present invention is set forth and characterized in the independent claims, while the dependent claims describe other characteristics of the invention or variants to the main inventive idea.

In accordance with the above purpose, a testing device to test a plate as previously described for electronic circuits, comprises transport means able to transport the plate along an axis of feed at least from an entrance station to a testing station defining a testing plane, and testing means disposed in correspondence with said testing station.

According to a characteristic feature of the present invention, the testing device also comprises an alignment station defining an alignment plane, disposed upstream of the testing station, and alignment means, disposed in correspondence with the alignment station, able to dispose the plate in an aligned position, in which the plate is disposed symmetrical both with respect to the axis of feed and also with respect to a first axis substantially transverse and substantially co-planar with the axis of feed.

According to an advantageous feature of the present invention, the transport means is able to move the plate, when it has been disposed in the aligned position, from the alignment station to the testing station.

According to another advantageous feature of the present invention, the plate is able to be disposed in the testing station in a testing position, in which the plate is disposed symmetrical both with respect to a second axis substantially parallel with respect to the first axis and also with respect to the axis of feed.

Advantageously the distance between the first axis and the second axis exactly coincides with the entity of movement from the alignment station to the testing station.

According to another advantageous feature of the present invention, the testing means is symmetrical both with respect to said second axis and also with respect to the axis of feed.

Advantageously, in the testing position, the plate is in axis with the testing means, which is also able to be moved substantially only along an axis substantially perpendicular to the testing plane.

Advantageously the alignment device also comprises image-acquisition means, such as a TV camera, disposed in correspondence with the alignment station so as to detect the position of the plate thereon, and processing and command means able to receive and process the information relating to the position of the plate and coming from the image acquisition means, so as to command the alignment means to dispose the plate in said aligned position.

In this way the plate to be tested is disposed in correspondence with the testing station already aligned with the testing means and ready to be tested. Therefore, the testing means is able to be moved only in a vertical direction so as to be disposed around and/or in contact with the plate in order to carry out the testing, and it does not need continuous corrections to its position in order to adapt to the position of the plate. In this way the testing processes are easier and quicker, with a consequent increase in productivity.

BRIEF DESCRIPTION OF THE DRAWINGS

These and other characteristics of the present invention will become apparent from the following description of a preferential form of embodiment, given as a non-restrictive example with reference to the attached drawing wherein.

DETAILED DESCRIPTION OF A PREFERENTIAL FORM OF EMBODIMENT

Figure 1:
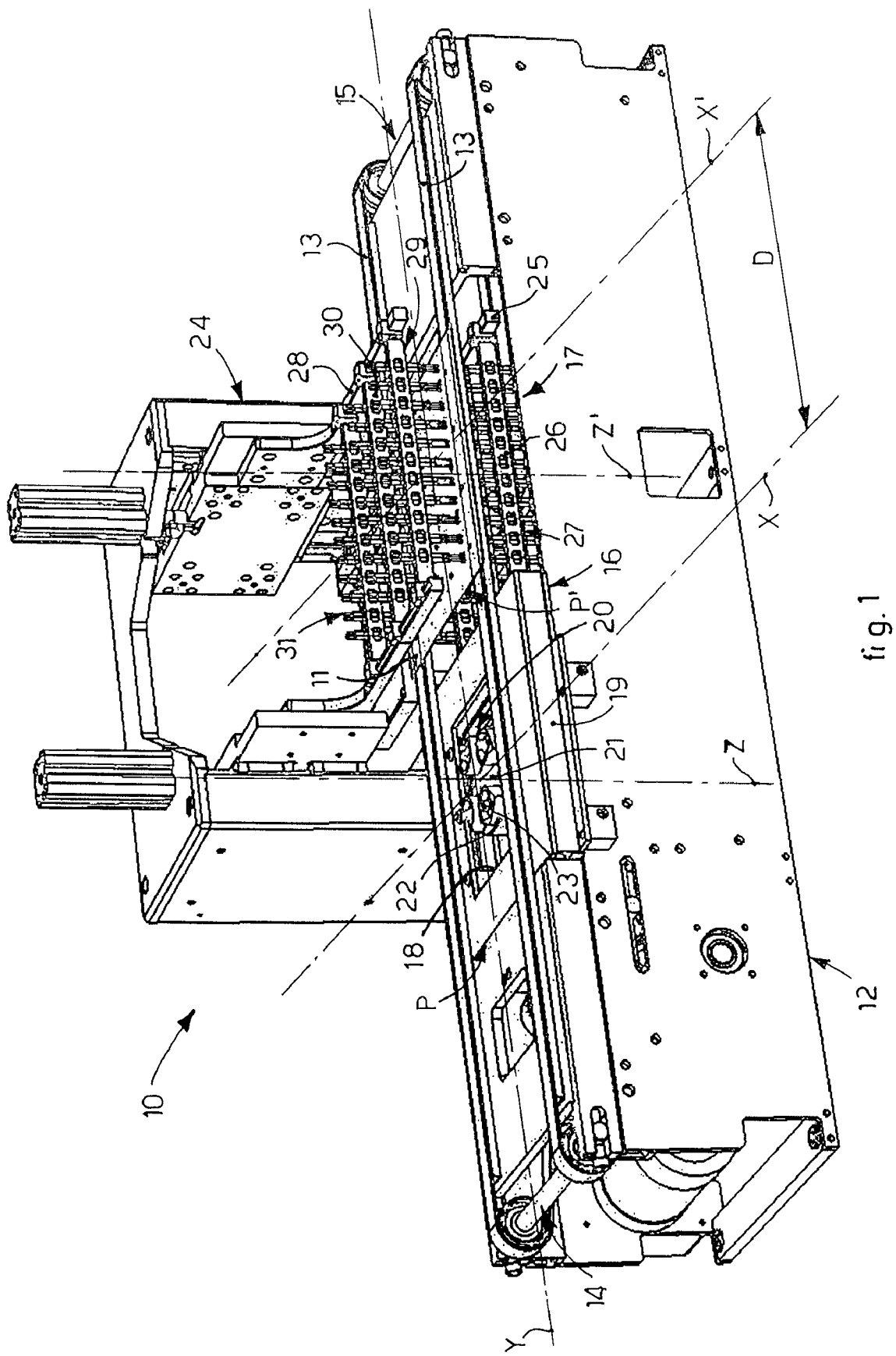
FIG. 1 is a three-dimensional view of a testing device according to the present invention.

With reference to FIG. 1, a testing device 10 according to the present invention to test a plate for electronic circuits, in this case for example a wafer 11, comprises a frame 12, on the upper surface of which a conveyor belt of a known type is able to slide. In this case the conveyor belt consists of two parallel belts 13 and is able to slide along an axis of feed Y, commanded by a drive member of a known type fixed to the frame 12. The conveyor belt is able to transport the wafer 11 from an entrance, station 14 to a discharge station 15. Between the entrance station 14 and the discharge station 15, the testing device 10 comprises an alignment station 16 defining an alignment plane P, and a testing station 17 defining a testing plane P'. In this case, the alignment station 16 is disposed upstream of the testing station 17. By alignment, here and hereafter, we mean the positioning of the wafer 11 on the alignment station 16 in a position symmetrical both with respect to the axis of feed Y and also with respect to a substantially transverse axis X substantially co-planar with the axis of feed Y.

The alignment station 16 consists of a box-like element 19 substantially square in shape attached by means of known attachment means to the upper part of the frame 12 and disposed underneath the parallel belts 13. The box-like element 19 is provided with an aperture 18 substantially square in shape disposed at the centre of the box-like element 19 and symmetrical with respect to the axis of feed Y.

In correspondence with the alignment station 16 and above it, the testing device 10 comprises a TV camera, not shown in the drawings, able to detect the position of the wafer 11 on the alignment station 16.

The testing device 10 also comprises a processing and command unit, not shown in the drawings, able to receive and process information arriving from the TV camera and relating to the position of the wafer 11 on the alignment station 16.

The testing device 10 also comprises an alignment turret 20, disposed below the alignment plane P, in correspondence with the aperture 18 and symmetrical with respect to the axis of feed Y.

In particular the alignment turret 20 comprises a manipulator 21, substantially circular in shape, shaped so as to define on its upper surface seatings 22, substantially semi-circular in shape, inside each of which a suction cup 23 is disposed.

The alignment turret 20 also comprises actuation means of a known type and not shown in the drawings, able to command the movement of the manipulator 21 along an axis Z, substantially perpendicular to the alignment plane P and substantially transverse to said axis X.

The alignment turret 20 also comprises rotation members, of a known type and not shown in the drawings, associated with the manipulator 21 and able to make the manipulator 21 rotate around the axis Z.

The alignment turret 20 also comprises sliding members, of a known type and not shown in the drawings, associated with said rotation members and the manipulator 21, able to move the latter along the axis X. The testing device 10 also comprises a support structure 24, disposed at the side of the frame 12 and substantially parallel to the axis of feed Y, provided with first cantilevered arms 25, disposed transverse to the axis of feed Y, able to support a first plate 26 provided with first rows of sensors 27 able to detect the intensity of the electric current, under the parallel belts 13 between the alignment station 16 and the discharge station 15. The first plate 26 actually constitutes the testing station 17. The support structure 24 also comprises second cantilevered arms 28 able to support a testing member 29, consisting in this case of a second plate 30 provided with second rows of sensors 31 able to detect the intensity of the electric current. The testing member 29 is symmetrical both with respect to the axis of feed Y and also with respect to an axis X', substantially parallel to the axis X and transverse to the axis of feed Y. The second cantilevered arms 28 are able to be moved along an axis Z', substantially perpendicular to the testing plane P' and substantially parallel to the axis Z', by movement means of a known type and not shown in the drawings.

The device according to the present invention functions as follows.

The conveyor belt transports the wafer 11, present in the entrance station 14 and arriving from a previous work station, to the alignment station 16. The TV camera then detects the position of the wafer 11 on the alignment station 16.

If, from the detection made by the TV camera, it can be seen that the wafer 11 is aligned, it is transported towards the testing station 17 so as to be subjected to the testing process, as described hereafter.

Otherwise, the alignment turret 20 is activated. In this case, the manipulator 21 is moved in the direction of the wafer 11 located on the alignment station 16, so as to make the suction cups 23 adhere to the lower surface of the wafer 11 and associate the wafer 11 to the alignment turret 20.

Then, on the basis of the information detected by the TV camera and processed by a control and processing unit, the rotation member and/or the sliding member is activated in order to perform the correction of the positioning of the wafer 11 so as to achieve the alignment. Once the alignment has been achieved the wafer 11 is transported, by means of the conveyor belt, from the alignment station 16 to the testing station 17 along a segment D of a defined entity, coinciding with the distance between the axis X and the axis X'. In correspondence with the testing station the wafer 11 is therefore in a symmetrical position both with respect to the axis of feed Y and also with respect to the axis X'. Therefore the wafer 11 and the testing member 29, and consequently the first and second rows of sensors 27, 31 are in axis. The testing member 29 is then moved along the axis Z' in the direction of the wafer 11, so that the second row of sensors 31 come into contact with the wafer 11 so as to test it.

When testing is complete, the testing member 29 is again moved along the axis Z' away from the wafer 11. The latter is then transferred from the testing station 17 to the discharge station 15 to be sent to subsequent treatment steps.

It is clear that modifications and/or additions of parts may be made to the testing device to test plates for electronic circuits as described heretofore, without departing from the field and scope of the present invention.

It is also clear that, although the present invention has been described with reference to some specific examples, a person of skill in the art shall certainly be able to achieve many other equivalent forms of testing device to test plates for electronic circuits, having the characteristics as set forth in the claims and hence all coming within the field of protection defined thereby.

The invention claimed is:

1. A testing device to test a plate for electronic circuits, comprising:
    a transport means having a support surface configured to support and transport said plate linearly along an axis of feed at least from an entrance station to a testing station defining a testing plane;
    a testing means disposed in correspondence with said testing station;
    an alignment station defining an alignment plane disposed upstream of said testing station; and
    an alignment means disposed within said alignment station, said alignment means having a support member that is movable in a direction substantially perpendicular to the alignment plane to engage said plate while said plate is supported by said support surface on said alignment station in said alignment plane and move the plate along a first axis to position said plate in an aligned position on the support surface in said alignment plane that is symmetrical both with respect to said axis of feed and also with respect to the first axis, wherein said first axis is substantially transverse to and co-planar with said axis of feed.

2. A testing device as in claim 1, wherein said transport means is able to move said plate, disposed in said aligned position, from said alignment station to said testing station along a segment.

3. A testing device as in claim 2, wherein said plate is able to be disposed in said testing station in a testing position, in which said plate is disposed symmetrical both with respect to a second axis and with respect to said axis of feed, wherein said second axis is substantially parallel to said first axis.

4. A testing device as in claim 3, wherein the distance between said first axis and said second axis is equal to the length of said segment.

5. A testing device as in claim 3, wherein said testing means is disposed symmetrical both with respect to said second axis and with respect to said axis of feed.

6. A testing device as in claim 3, wherein said testing means is able to be moved along a third axis substantially perpendicular to said testing plane.

7. A testing device as in claim 1, comprising image acquisition means, disposed in correspondence with said alignment station, able to detect the position of said plate on said alignment station.

8. A testing device as in claim 7, comprising processing and control means able to receive and to process information relating to the position of said plate on said alignment station in order to command said alignment means.

9. A testing device as in claim 1, wherein said alignment means is disposed below said alignment plane.

10. A testing device as in claim 1, wherein said alignment means is able to rotate said plate around an axis that is substantially perpendicular to the alignment plane.

11. A testing method to test a plate for electronic circuits, wherein a transport means has a support surface configured to support and transport said plate linearly along an axis of feed at least from an entrance station to a testing station defining a testing plane, and wherein a testing means is disposed in correspondence with said testing station, the method comprising:
transporting said plate disposed on said support surface onto an alignment station disposed upstream of said testing station using said transport means; and
moving a support member of an alignment means disposed in said alignment station in a direction substantially perpendicular to an alignment plane defined by the alignment station to engage said plate while said plate is supported by the support surface in said alignment plane and move said plate along a first axis to position said plate in an aligned position on the support surface in said alignment plane that is symmetrical both with respect to said axis of feed and also with respect to the first axis, wherein said first axis is substantially transverse to and co-planar with said axis of feed.

12. A testing method as in claim 11, comprising moving said plate, disposed in said alignment position, from said alignment station to a testing position in said testing station along a segment.

13. A testing method as in claim 12, wherein said plate is symmetrical both with respect to a second axis and with respect to said axis of feed when said plate is in said testing position, wherein said second axis is substantially parallel to said first axis.

14. A testing method as in claim 11, wherein an image acquisition means, disposed in correspondence with said alignment station, detects the position of said plate on said alignment station.

15. A testing method as in claim 14, wherein a processing and control means receives and processes information relating to the position of said plate on said alignment station in order to command said alignment means.

16. A testing device to test a plate for electronic circuits, comprising:
a conveyor having a support surface configured to support and transport the plate linearly along an axis of feed at least from an entrance station to a testing station defining a testing plane;
a testing member disposed in the testing station;
an alignment station defining an alignment plane disposed upstream from the testing station; and
an alignment manipulator disposed within the alignment station, wherein the alignment manipulator is movable in a direction substantially perpendicular to the alignment plane to engage the plate while the plate is supported by the support surface on the alignment station in the alignment plane and move the plate along a first axis to position the plate in an aligned position on the support surface in the alignment plane that is symmetrical both with respect to the axis of feed and also with respect to the first axis, wherein the first axis is substantially transverse to and co-planar with the axis of feed.

17. The testing device of claim 1, wherein the alignment manipulator is configured to rotate the plate around an axis that is substantially perpendicular to the alignment plane.

* * * * *

UNITED STATES PATENT AND TRADEMARK OFFICE
CERTIFICATE OF CORRECTION

PATENT NO. : 7,960,980 B2
APPLICATION NO. : 12/256682
DATED : June 14, 2011
INVENTOR(S) : Baccini It is certified that error appears in the above-identified patent and that said Letters Patent is hereby corrected as shown below:

Title Page, item (73) In the Assignee:

Please delete "Applied Materials, Inc., Santa Clara, CA (US)" and insert --Applied Materials, Inc., San Biagio di Callalta (IT)-- therefor.

Signed and Sealed this
Twenty-third Day of April, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 7,960,980 B2
APPLICATION NO. : 12/256682
DATED : June 14, 2011
INVENTOR(S) : Baccini Page 1 of 1

It is certified that error appears in the above-identified patent and that said Letters Patent is hereby corrected as shown below:

Title Page, item (73) In the Assignee:

Please delete "Applied Materials, Inc., Santa Clara, CA (US)" and insert
--Applied Materials Italia S.R.L., San Biagio di Callalta (IT)-- therefor.

This certificate supersedes the Certificate of Correction issued April 23, 2013.

Signed and Sealed this
Twelfth Day of November, 2013

Teresa Stanek Rea
*Deputy Director of the United States Patent and Trademark Office*